United States Patent [19]

Ito

[11] Patent Number: 5,180,477
[45] Date of Patent: Jan. 19, 1993

[54] THIN FILM DEPOSITION APPARATUS

[75] Inventor: Hiroki Ito, Amagasaki, Japan

[73] Assignee: Mitsubishi Denki Kabushiki Kaisha, Tokyo, Japan

[21] Appl. No.: 718,367

[22] Filed: Jun. 20, 1991

[30] Foreign Application Priority Data

Jun. 25, 1990 [JP] Japan .................. 2-164184

[51] Int. Cl.$^5$ ............................. C23C 14/00
[52] U.S. Cl. ................... 204/298.05; 118/723; 118/726; 250/492.3; 427/531; 427/571; 427/573
[58] Field of Search ............. 204/298.05, 192.31; 118/723, 726; 427/38; 250/492.3

[56] References Cited

U.S. PATENT DOCUMENTS 4,424,104  1/1984  Harper et al. ............ 204/192.31

FOREIGN PATENT DOCUMENTS

| | | |
|---|---|---|
| 4027896 | 3/1991 | Fed. Rep. of Germany . |
| 61-174370 | 8/1986 | Japan ................. 118/726 |
| 62-14416 | 1/1987 | Japan ................. 118/726 |
| 685269 | 12/1952 | United Kingdom . |
| 1344432 | 1/1974 | United Kingdom . |
| 1466786 | 3/1977 | United Kingdom . |
| 1518911 | 7/1978 | United Kingdom . |
| 2200654 | 8/1988 | United Kingdom ........... 204/298.05 |

OTHER PUBLICATIONS

J. Nuclear Instr. Meth., 35 (1965), pp. 165-166.
JP-A 63-277754, Pat. Abstr. JP. C-575, Mar. 13, 1989; vol. 13, No. 105.

*Primary Examiner*—Aaron Weisstuch
*Attorney, Agent, or Firm*—Oblon, Spivak, McClelland, Maier & Neustadt

[57] ABSTRACT

In a thin film deposition apparatus, a vapor generation source including a crucible containing a desposition material is disposed inside an ionization means, the crucible being disposed below a cathode filament. Since the upper section of the crucible is heated by the heat of the filament, the creeping up of a molten metal deposition material having a good wettability can be suppressed. Also, the temperature of a surrounding anode is maintained higher than the melting point of the deposition material because the crucible disposed in the ionization means is heated. Therefore, the deposition of the material onto the anode can be prevented.

5 Claims, 3 Drawing Sheets

THIN FILM DEPOSITION APPARATUS

BACKGROUND OF THE INVENTION

1. Field of the Invention

The present invention relates to a thin film deposition apparatus and, in particular, to a thin film deposition apparatus for depositing thin films by physical vapor deposition (PVD) through which thin films are formed by using ion beams and electron beams.

2. Description of the Related Art

High-quality thin films, such as semiconductors, optical thin films, magnetic films, or insulating films, have previously been formed by sputtering or through low-energy ion-beam assisted deposition.

FIG. 3 schematically shows a conventional thin film deposition apparatus presented, for example, in "Journal of Vacuum Science and Technology (*J. Vac. Sci. Technol.*), B2(3), Aug. to Sep., 1984". In FIG. 3, a sealed type crucible 3 is disposed in the lower section of a vapor generation source 7 of an ion source apparatus placed inside a vacuum chamber (not shown), the inside of which is maintained at a predetermined vacuum. An orifice 4 is formed above the crucible 3, and a deposition material 5 is housed in the crucible 3. A heater 6 heats the crucible 3. The crucible 3, the orifice 4, and the heater 6 constitute the vapor generation source 7.

A cathode (filament) 10 from which an electron beam is emitted and an anode 11 which attracts electrons from the cathode 10 constitute an ionization means 12. An acceleration electrode 16 and a grounded electrode 17 constitute an acceleration means 19 for accelerating a deposition material ionized by the ionization means 12 in an electric field and providing it with kinetic energy.

With the above-mentioned construction, the vacuum chamber is discharged by a vacuum discharge system until the vacuum chamber attains a vacuum of approximately 106 Torr. After that, the crucible 3 is heated by the heater 6. As a result, the deposition material 5 inside the crucible 3 evaporates and is transported to the ionization means 12 through the orifice 4. The vapor of the deposition material 5 collides with the electron beam emitted from the cathode 10 and is ionized. The ionized vapor of the deposition material 5 is accelerated by an electric field applied by an acceleration electrode 16 of the acceleration means 19 and a grounded electrode 17 and collides with the surface of a substrate (not shown). Thus, a thin film is formed.

Such a conventional thin film deposition apparatus has a problem in that, if a deposition material having a good wettability with a crucible material, such as silicon (Si) or aluminum (Al), is used, a phenomenon such that the molten deposition material creeps up on the side of the orifice or oozes out around the crucible 3, and therefore, the ion source cannot be operated stably. Another problem arises in that since these molten metals undergo a violent reaction with a material forming an ion source, a portion which is in contact with the molten metal corrodes and the lifetime of the apparatus becomes extremely short.

Still another problem is that in a conventional deposition method in which ions of a low energy (20 to 500 eV) are used, the ratio of a generated ion beam to the vapor which it occupies is 5% or less at most, and therefore the ratio of ions used is small, so there is a limitation on the improvement of the performance of thin film devices formed on a substrate.

Still another problem is that even if an attempt is made to control the properties of thin films by the acceleration voltage, the number of ions which reach the substrate is very small, particularly if the acceleration voltage is low, and therefore high-quality thin films cannot be formed when low-energy ions are utilized.

Still another problem is that when the acceleration voltage approaches zero, electrons emitted from the cathode (filament) begin to strike the substrate, and thereby cause damage to the substrate.

SUMMARY OF THE INVENTION

The present invention has been devised in order to solve the above-mentioned problems. It is accordingly an object of the present invention to provide a thin film deposition apparatus which is capable of (1) stably operating even if a deposition material having a good wettability is used; (2) realizing an ion generation with a high ionization efficiency of 70% or more; (3) implanting a fixed amount of ions onto a substrate even if the acceleration voltage is changed; and (4) utilizing the properties of low-energy ions. The thin film deposition apparatus, in which no damage is caused to a substrate by electrons emitted from a filament colliding with the substrate, can form high-quality, uniformly thin films.

A thin film deposition apparatus comprises a vacuum chamber in which a predetermined vacuum is maintained; a substrate placed inside this vacuum chamber; a crucible placed in such a manner so as to oppose the substrate inside the vacuum chamber for housing a deposition material whose metallic ions impinge the substrate; a heater disposed around the crucible for heating the crucible; a cathode placed in the vicinity of the opening of the crucible; and an anode disposed in such a manner as to surround the crucible, the heater and the cathode.

According to the present invention, since the upper section of the crucible is heated by the heat of the filament, i.e., a cathode, the creeping of a molten metal of good wettability can be suppressed. Also, the temperature of the anode is maintained higher than the melting point of the deposition material because the crucible disposed in the ionization means is heated. Therefore, the deposition of the material onto the anode can be prevented.

Electrons from the cathode are directly injected into the vapor emitted from the crucible, and a means for applying a magnetic field for increasing the plasma density of a glow discharge is disposed in the ionization means. Therefore, ionization can be performed with a very high degree of efficiency.

In addition, if a negatively biased extraction electrode is disposed between the acceleration electrode and the grounded electrode, the collision of thermal electrons with a substrate, causing damage to the substrate, can be suppressed. Ions which impinge the substrate can be maintained at a certain level or higher even if the acceleration voltage is changed.

DESCRIPTION OF THE PREFERRED EMBODIMENT

Figure 1:
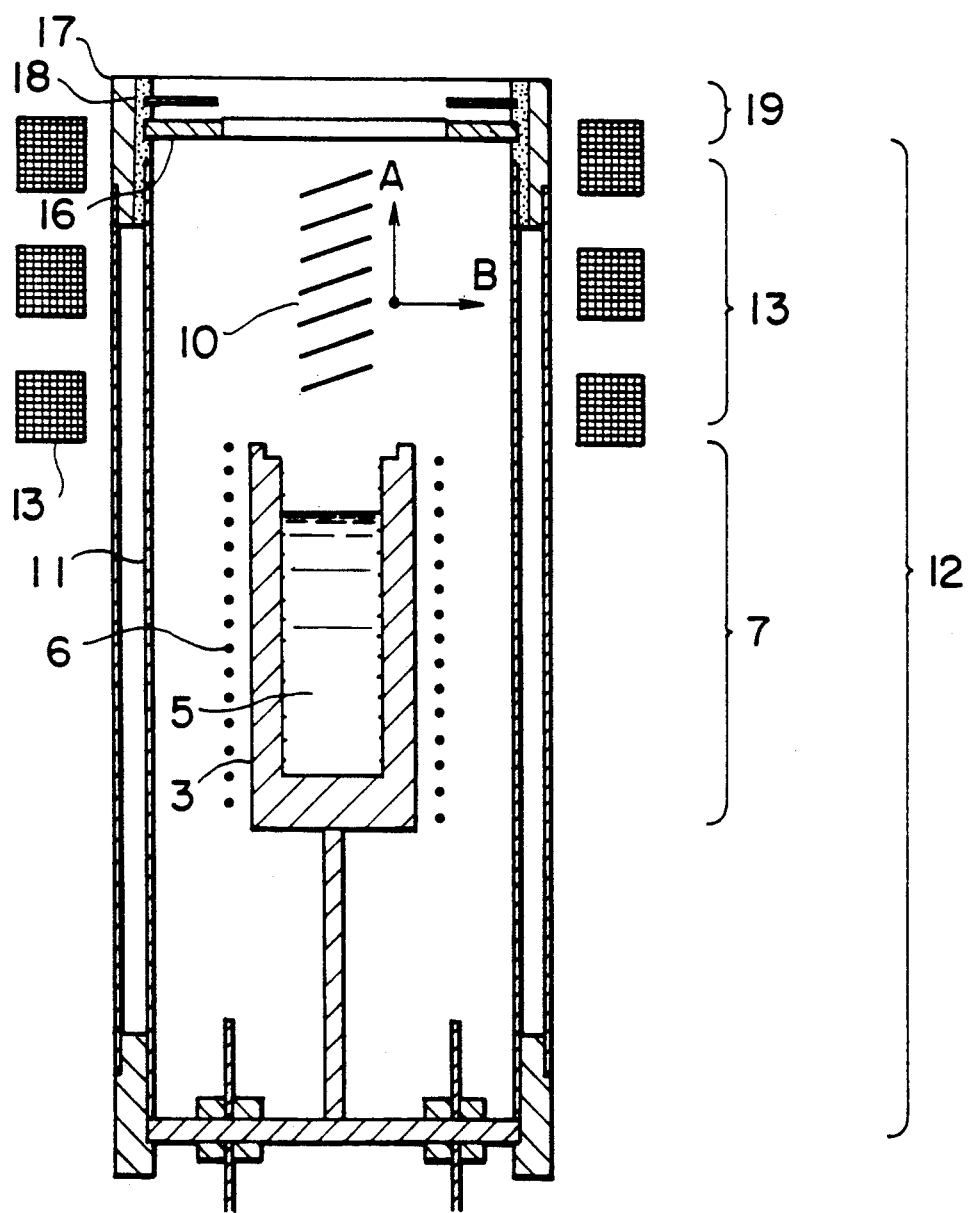
FIG. 1 is a schematic sectional view of a thin film deposition apparatus of an embodiment of the present invention.

An embodiment of the present invention will be explained below with reference to FIG. 1. In FIG. 1, a crucible 3 is disposed below a spirally-shaped cathode filament 10 inside an ionization means 12. A heater 6 is disposed around the crucible 3. A vapor generation source 7 consists of the crucible 3 and the heater 6. The vapor generation source 7 is disposed inside the ionization means 12 consisting of cathode 10 and a cylindrical anode 11. A magnetic-field applying means is disposed outside the ionization means 12. An acceleration electrode 16 set at an electrical potential equal to that of anode 11, an extraction electrode 18 which is negatively biased with respect to the acceleration electrode, and a grounded electrode 17 constitute an acceleration means 19.

The vapor of the deposition material 5 formed inside the crucible 3 of the vapor generation source 7 is heated in the same way as in the above-described conventional apparatus. At this time, the upper section of the crucible 3 is heated by the heat from the filament, i.e., the cathode 10, and is maintained at a temperature higher than the lower section of the crucible 3 by the heater 6. Therefore, the creeping of a molten metal of good wettability can be suppressed and the ion source can be operated stably. The temperature of the anode 11 is maintained higher than the melting point of the deposition material 5 by the heat from the heated crucible 3 constituting the vapor generation source 7 disposed in the ionization means 12. As a result, no such phenomenon will occur where the deposition material 5 is condensed and deposited on the anode 11. Therefore, there is no problem where the apparatus corrodes due to reaction between the deposition material 5 and an ion source material, resulting in the lifetime of the apparatus being shortened. In addition, electrons emitted from the cathode 10 are directly injected into the vapor emitted from the crucible 3 and the vapor is thereby ionized. A magnetic-field applying means 13 for increasing the plasma density of a glow discharge is disposed in the ionization means 12. A magnetic field of approximately several hundred gauss is applied so that electrons can rotate between the anode 11 and the cathode 10. As a result, a high ionization efficiency of 70% or more can be achieved. In FIG. 1, reference character A denotes a magnetic field; and reference character B denotes an electric field.

These ions are accelerated by the acceleration means 19 and deposited on the surface of a substrate (not shown), thus forming a thin film. At this time, because the extraction electrode 18 is negatively biased with respect to the acceleration electrode 16, extracted ions are accelerated between the extraction electrode 18 and the acceleration electrode 16 and then decelerated by the grounded electrode 17. Finally, ions impinge the substrate with a kinetic energy equal to the electrical potential (acceleration voltage) between the acceleration electrode 16 and the grounded electrode 17. Therefore, if the voltage between the acceleration electrode 16 and the extraction electrode 18 is fixed, an amount of ions of a required level or higher can be secured even if the acceleration voltage is changed. As a consequence, the formation of thin films in which the properties of low-energy ions are utilized is made possible even when the acceleration voltage is small. Also, since the extraction electrode 18 is negatively biased with respect to the grounded substrate at all times, there is an advantage in that the irradiation of electrons emitted from the cathode 10 onto the substrate can be suppressed.

Figure 2:
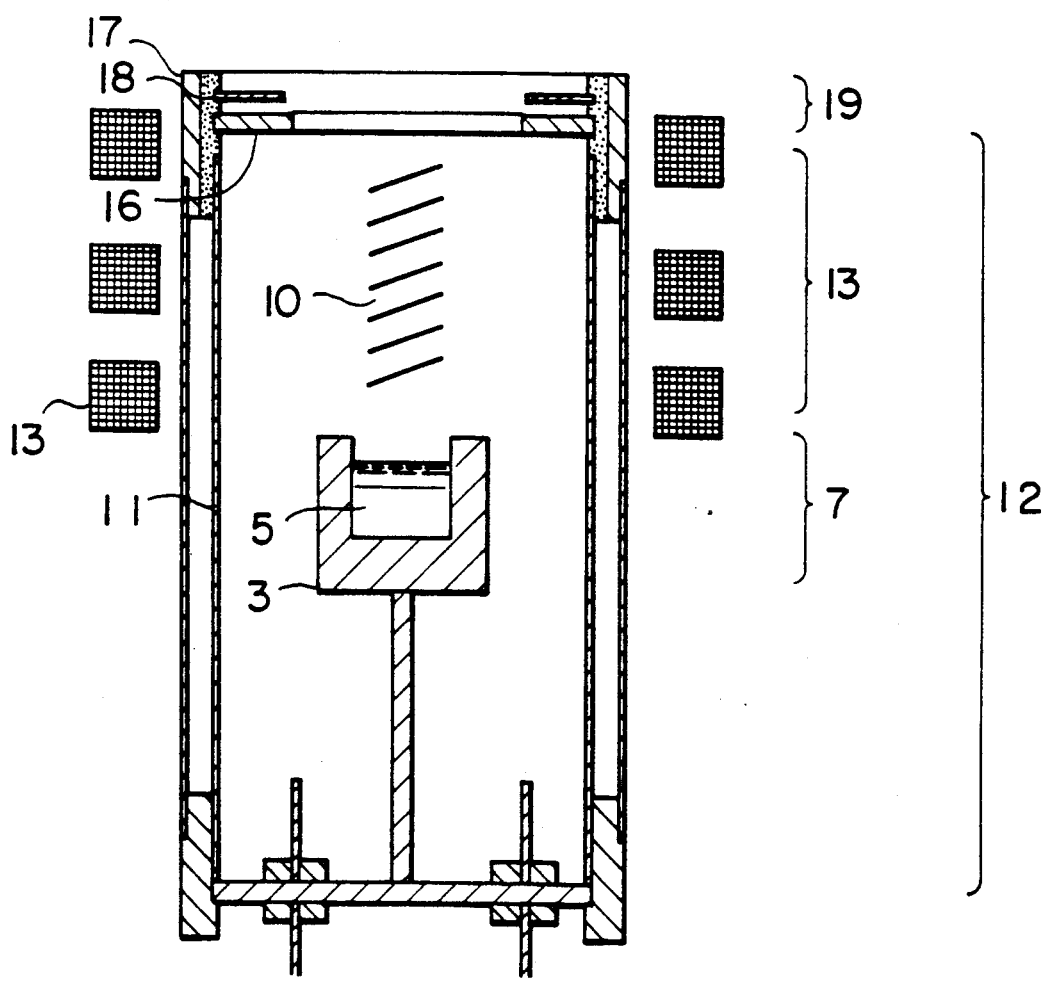
FIG. 2 is a schematic sectional view of a thin film deposition apparatus of another embodiment of the present invention.
Figure 3:
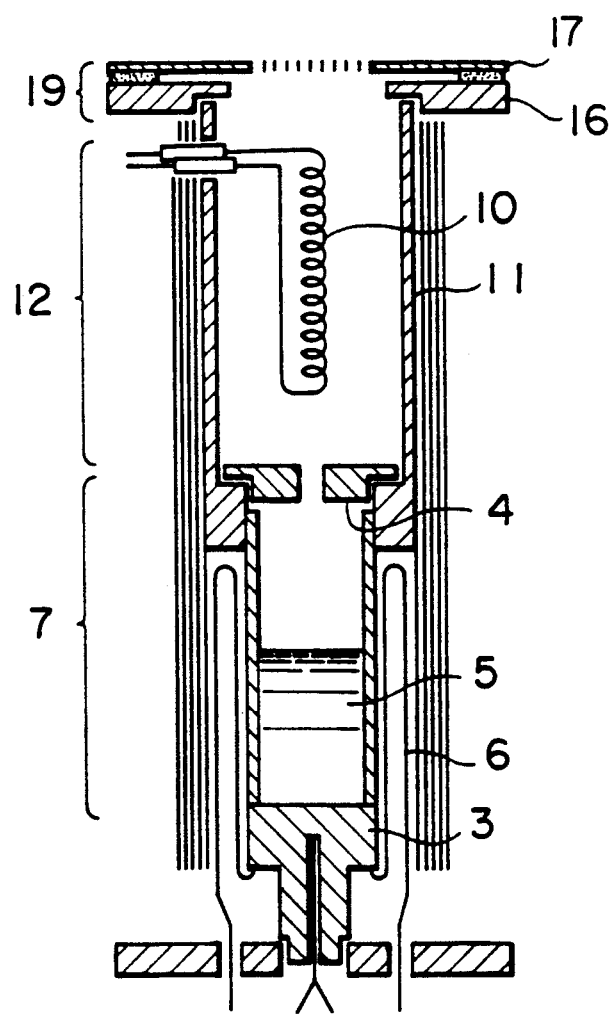
FIG. 3 is a schematic sectional view of a conventional thin film deposition apparatus.

In the above-described embodiment, a case in which the crucible 3 is heated by the heater 6 is shown. As shown in FIG. 2 in another embodiment, regarding the heating of the crucible 3, a similar effect can be obtained by a method in which the deposition material 5 is melted by an electron beam emitted from the cathode (filament) 10 and evaporated, and the apparatus is thus simplified.

As has been explained above, according to the present invention, since a vapor generation source is disposed inside an ionization means and a crucible is disposed below a cathode, the apparatus can operate stably with a high degree of ionization efficiency even if a deposition material having a good wettability and a vigorous corrosiveness is used and can form thin films by implanting ions of a required level even when the acceleration voltage is small. Therefore, high-quality thin films can be formed even with a low acceleration voltage. Such devices which utilize low energy ion acceleration have recently gained important recognition in the development of electronic devices. Also, since the irradiation of electrons onto a substrate can be suppressed, little or no damage to the substrate results.

I claim:

1. A thin film deposition apparatus comprising:
 a vacuum chamber in which a predetermined vacuum is maintained;
 a means for mounting a substrate placed inside the vacuum chamber;
 a crucible placed in such a manner as to oppose the substrate inside the vacuum chamber for housing a deposition material whose metallic ions impinge the substrate;
 a heater disposed around the crucible for heating the crucible;
 a cathode filament placed in the vicinity of the opening of the crucible; and
 an anode disposed in such a manner as to surround the crucible, the heater and the cathode, wherein said anode is adapted to be maintained at a temperature higher than the melting point of said deposition material.

2. The apparatus according to claim 1 further comprising acceleration means for accelerating the ionized deposition material towards the substrate.

3. The apparatus according to claim 2 wherein the acceleration means comprises an acceleration electrode whose electrical potential is the same as that of the anode, a negatively biased extraction electrode and a grounded electrode, these electrodes being disposed between the cathode and the substrate.

4. The apparatus according to claim 3 wherein said acceleration electrode and said extraction electrode are maintained at a fixed voltage difference in relation to each other.

5. The apparatus according to claim 1 further comprising means for applying a magnetic field to the metallic ions of the deposition material, said applying means being disposed so as to surround the vacuum chamber.

* * * * *